(12) United States Patent
Fumitake et al.

(10) Patent No.: US 9,117,906 B2
(45) Date of Patent: Aug. 25, 2015

(54) FIN FIELD-EFFECT TRANSISTORS AND FABRICATION METHOD THEREOF

(71) Applicant: Semiconductor Manufacturing International Corp., Shanghai (CN)

(72) Inventors: Mieno Fumitake, Shanghai (CN); Huaxiang Yin, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 110 days.

(21) Appl. No.: 13/861,584

(22) Filed: Apr. 12, 2013

(65) Prior Publication Data

US 2014/0203369 A1 Jul. 24, 2014

(30) Foreign Application Priority Data

Jan. 22, 2013 (CN) .......................... 2013 1 0023625

(51) Int. Cl.
*H01L 29/66* (2006.01)
*H01L 21/336* (2006.01)
*H01L 29/78* (2006.01)

(52) U.S. Cl.
CPC ........ *H01L 29/785* (2013.01); *H01L 29/66545* (2013.01); *H01L 29/66795* (2013.01); *H01L 29/7854* (2013.01)

(58) Field of Classification Search
CPC .................. H01L 29/66545; H01L 29/66795; H01L 29/785; H01L 29/7854; H01L 21/823821; H01L 21/845; H01L 21/823431; H01L 27/1211; H01L 27/0886
USPC ......... 257/347, 192, 262, 306, 327, 329, 330, 257/332, 340, 369, 386, 392, 412, 5, 722, 257/77, E21.409, 288, 401, E29.255, 257/E21.444, E27.06, E21.09, E21.19, 257/E27.112, 368, E21.421, E21.546, 257/E21.703, E27.062, E29.262, 308, 334, 257/351, 408, E21.159, E21.411, E21.435, 257/E21.54, E21.628, E21.632, E21.634, 257/E21.635, E21.637, E21.648, E21.7, 257/E27.002, E27.004, E27.016, E27.061, 257/E29.001, E29.022, E29.137, E29.151, 257/E29.242, E29.266, E29.275, E45.001, 257/E47.005; 438/283, 157, 284, 595, 197, 438/299, 300, 478, 479, 585, 154, 231, 294, 438/424, 149, 151, 158, 163, 176, 199, 216, 438/229, 239, 257, 268, 272, 281, 285, 286, 438/289, 296, 301, 303, 382, 399, 400, 430, 438/517, 592
See application file for complete search history.

(56) References Cited

U.S. PATENT DOCUMENTS

2005/0145932 A1* 7/2005 Park et al. ..................... 257/328
2011/0147812 A1 6/2011 Steigerwald et al.
(Continued)

*Primary Examiner* — Colleen A Matthews
*Assistant Examiner* — Junaiden Mirsalahuddin
(74) *Attorney, Agent, or Firm* — Anova Law Group, PLLC (57) ABSTRACT

A method is provided for fabricating a fin field-effect transistor. The method includes providing a semiconductor substrate, and forming a plurality of fins with hard mask layers and an isolation structure. The process also includes forming a first dummy gate layer on the fins and the isolation structure, and polishing the first dummy gate layer until the hard mask layer is exposed. Further, the method includes removing the hard mask layer to expose a top surface of the fins, and forming a second dummy gate material layer on the first dummy gate material layer. Further, the method also includes etching the second dummy gate layer and the first dummy gate layer to form a dummy gate on each of the fins.

13 Claims, 9 Drawing Sheets

(56) References Cited

U.S. PATENT DOCUMENTS

| | | | |
|---|---|---|---|
| 2012/0292707 A1* | 11/2012 | Toh et al. | 257/365 |
| 2012/0292715 A1* | 11/2012 | Hong et al. | 257/392 |
| 2012/0315732 A1* | 12/2012 | Kang et al. | 438/197 |
| 2013/0153997 A1* | 6/2013 | Chang et al. | 257/334 |
| 2013/0200470 A1* | 8/2013 | Liu et al. | 257/408 |
| 2014/0048881 A1* | 2/2014 | Kanike et al. | 257/347 |

* cited by examiner

FIN FIELD-EFFECT TRANSISTORS AND FABRICATION METHOD THEREOF

CROSS-REFERENCES TO RELATED APPLICATIONS

This application claims the priority of Chinese patent application No. 201310023625.5, filed on Jan. 22, 2013, the entirety of which is incorporated herein by reference.

FIELD OF THE INVENTION

The present invention generally relates to the field of semiconductor manufacturing technology and, more particularly, relates to fin field-effect transistors and fabrication techniques thereof.

BACKGROUND

In a metal-oxide-semiconductor field-effect transistor (MOSFET), voltage is applied on the gate to control the current in a channel region to generate a switching signal (on-off). However, when semiconductor technology enters into a sub-45 nm node, the channel current control ability of traditional planar MOSFETs may become weak, thus a severe leakage current may be generated. Fin field-effect transistors (FinFET) are novel multiple-gate devices. A FinFET may include semiconductor fin structures protruding from the surface of a semiconductor substrate, a gate structure covering top and side surfaces of the fin structure, and source/drain regions in the fin structure at both sides of the gate structure.

Figure 1:
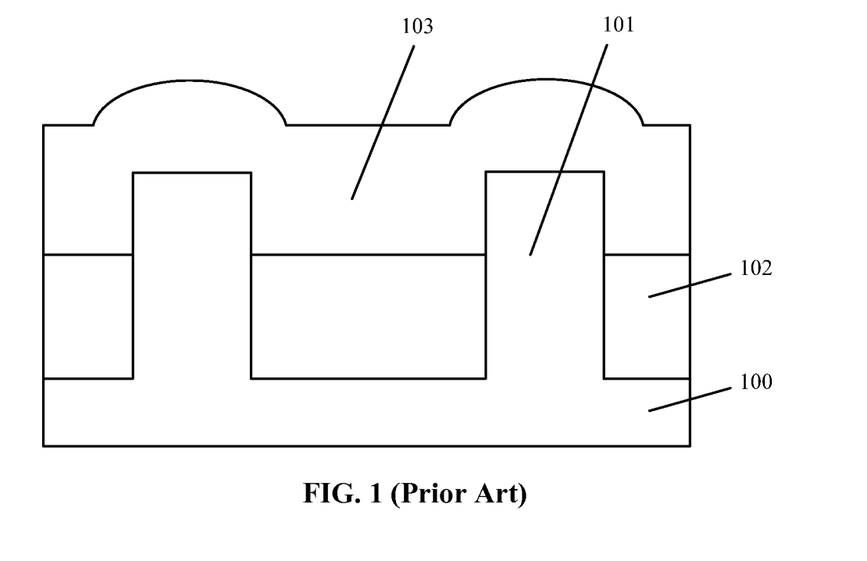
FIG. 1 illustrates an existing fin field-effect transistor.

In a gate-last process, a dummy gate may be formed first, followed by sequentially forming a sidewall spacer, source/drain regions, and an interlayer dielectric layer; then the dummy gate may be removed, and a gate structure may be formed. In the gate-last process for forming a FinFET, because fins may protrude from the surface of a semiconductor substrate, the surface of a dummy gate formed on the surface of the semiconductor substrate may be uneven. FIG. 1 illustrates a dummy gate structure of an existing fabrication process for forming a FinFET. The FinFET includes a semiconductor substrate 100; a plurality of protruding fins 101 on the semiconductor substrate 100; and a plurality of insulation structures 102 in between adjacent fins 101 covering a surface of the semiconductor substrate 100 and a portion of surfaces of the fins 101. A surface of the isolations structures 102 is lower than a surface of the fins 101. The FinFET also includes a dummy gate material layer 103 on the fins 101 and the isolation structures 102.

Referring FIG. 1, because the top surface of the isolation structures 102 is lower than the top surface of the fins 101, groves may be formed in between adjacent fins 101. After forming the dummy gate material layer 103, the groves are filled with the dummy gate material layer 103. The surface of a portion of the dummy gate material layer 103 on the isolation structures 102 is lower than the surface of a portion of the dummy gate material layer 103 on the fins. Thus, the surface of the dummy gate material layer 103 is uneven, which may affect subsequent processes.

In order to solve the uneven surface problem, a chemical mechanical polishing (CMP) process may be used to polish the surface of the dummy gate material layer 103. After the CMP process, the surface of the portion of the dummy gate material layer 103 on the isolation structure 102 may level with the surface of the portion of the dummy gate material layer 103 on the fins 101. However, there may be no polishing stop layer in the CMP process, the thickness of a remaining portion of the dummy gate material layer 103 after the CMP process may be difficult to control. Therefore, the thickness of the remaining dummy gate material layer may be uneven. The disclosed device structures, methods and systems are directed to solve one or more problems set forth above and other problems.

BRIEF SUMMARY OF THE DISCLOSURE

One aspect of the present disclosure includes a method for fabricating a fin field-effect transistor. The method includes providing a semiconductor substrate, and forming a plurality of fins with hard mask layers and an isolation structure. The process also includes forming a first dummy gate layer on the fins and the isolation structure, and polishing the first dummy gate layer until the hard mask layer is exposed. Further, the method includes removing the hard mask layer to expose a top surface of the fins, and forming a second dummy gate material layer on the first dummy gate material layer. Further, the method also includes etching the second dummy gate layer and the first dummy gate layer to form a dummy gate on each of the fins.

Another aspect of the present disclosure includes a fin field-effect transistor. The fin field-effect transistor includes a semiconductor substrate having a plurality of fins and an isolation layer. The fin field-effect transistor also includes embedded source/region regions in both sides of the fins. Further, the fin field-effect transistor includes a high-K metal gate and sidewall spacers. Further, the FinFET also includes an interlayer dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 17:
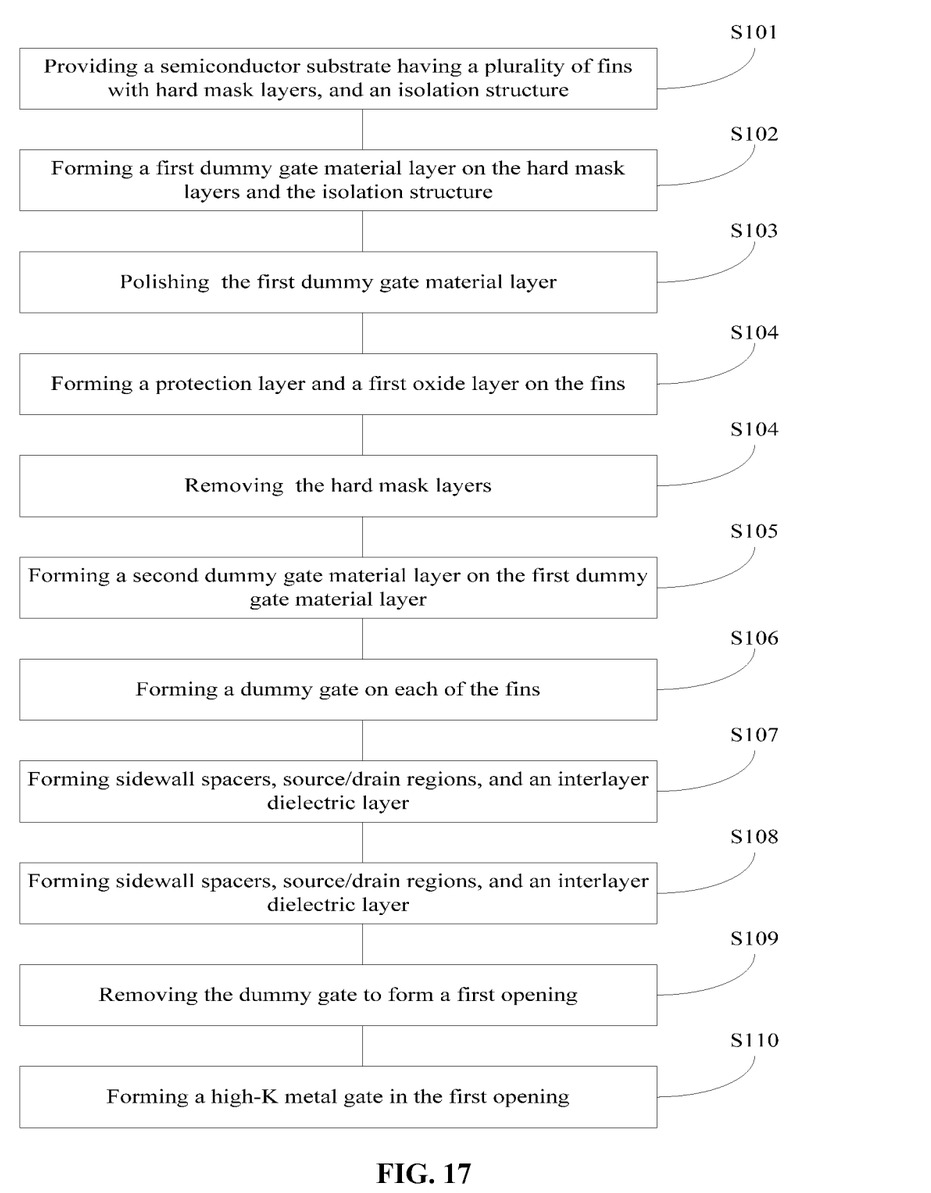
FIG. 17 illustrates an exemplary fabrication process for a fin field-effect transistor consistent with the disclosed embodiments.

FIG. 17 illustrates an exemplary fabrication process for a fin field-effect transistor (FinFET), and FIGS. 2-11 illustrate exemplary semiconductor structures corresponding to various stages of the fabrication process.

Figure 2:
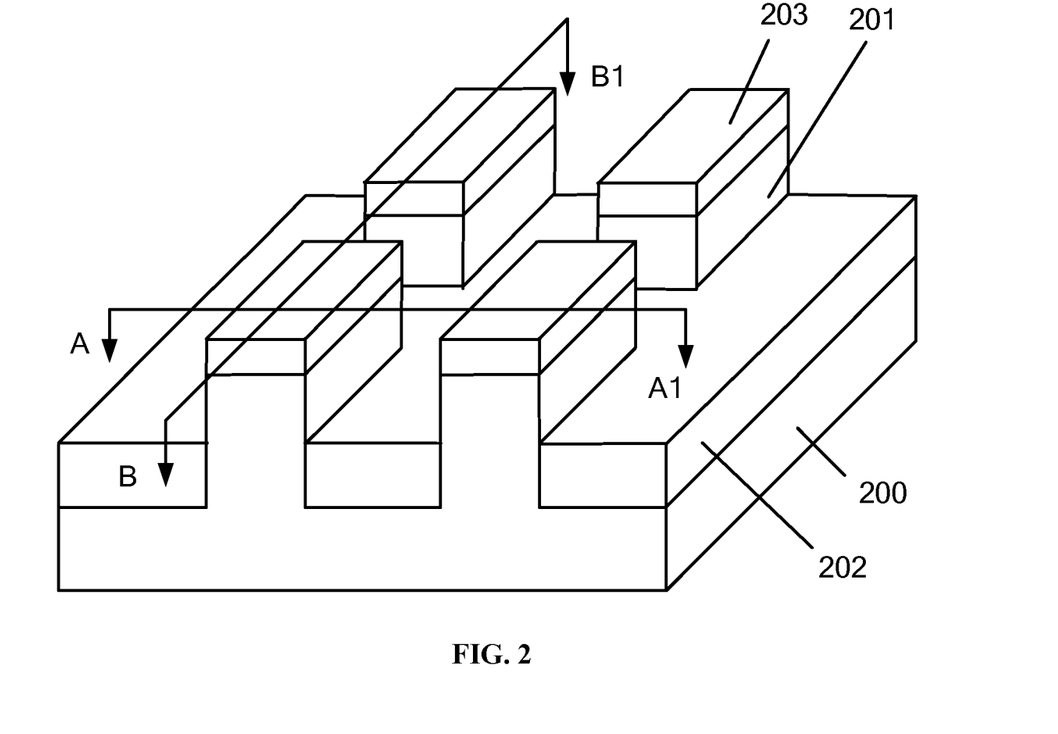
FIGS. 2-11 illustrate semiconductor structures corresponding to certain stages of an exemplary fabrication process for forming a fin field-effect transistor consistent with the disclosed embodiments.

As shown in FIG. 17, at the beginning of the fabrication process, a semiconductor substrate with certain structures is provided (S101). FIG. 2 illustrates a corresponding semiconductor structure.

As shown in FIG. 2, a semiconductor substrate 200 is provided. The substrate 200 may have a plurality of fins 201 on one surface. Each of the fins 201 may have a hard mask layer 203 on a top surface. Adjacent fins 201 may be isolated by an isolation structure 202. The top surface of the fins 201 may be higher than a top surface of isolation structure 202. Further, a distance between the top surface of the fins 201 and the top surface of the isolation structure 202 may be greater than a thickness of the hard mask layer 203.

The semiconductor substrate 200 may include any appropriate semiconductor materials, such as silicon, silicon on insulator (SOI), silicon germanium, carborundum, indium antimonide, lead telluride, indium arsenide, indium phosphide, gallium arsenide, gallium antimonite, ally semiconductor or a combination thereof. The substrate 200 provides a base for subsequent processes and structures.

The fins 201 may be formed by etching the semiconductor substrate 200. A etching process for forming the fin 201 may be a dry etching process including a plasma etching process, or an ion beam etching process. In certain other embodiments, the fin 201 may be formed by depositing a semiconductor material on the semiconductor substrate 200, followed by the etching process. The fins 201 may also be formed directly by depositing a semiconductor material on the semiconductor substrate 200 using a shadow mask having patterns of the plurality of fins 201. The fins 201 may be made of a same material as the semiconductor substrate 200, or a different semiconductor material including one or more of silicon, silicon germanium, carborundum, indium antimonide, lead telluride, indium arsenide, indium phosphide, gallium arsenide, gallium antimonite, or ally semiconductor, etc.

After forming the fins 201, an isolation structure 202 may be formed to isolate adjacent fins 201. Referring to FIG. 2, a top surface of the isolation structure 202 may be lower than top surfaces of the fins 201. In one embodiment, the isolation structure 202 may be a shallow trench isolation (STI) structure. The STI structure may be made of any appropriate material such as silicon oxide, silicon nitride, or silicon oxynitride, etc. In one embodiment, the STI structure is made of silicon oxide. The STI structure (refer to the isolation structure 202) may be formed by various processes, such as a chemical vapor deposition (CVD) process, a physical vapor deposition (PVD) process, an atomic layer deposition (ALD) process, or a flowable chemical vapor deposition (FCVD) process, etc.

Referring to FIG. 2, the hard mask layer 203 may be formed on each of the fins 201. The hard mask layer 203 may be a remaining mask layer of the process for forming the fins 201 by the etching process. The hard mask layer 203 may also be a remaining etching stop layer of the process for forming the isolation structure 202. The hard mask layer 203 may also be formed by an individual process. The hard mask layer 203 may be a single layer, or a stacked structure. In one embodiment, the hard mask layer 203 is a stacked structure having a silicon oxide layer and a silicon nitride layer, and the silicon nitride layer may be on top of the silicon oxide layer. Other appropriate material may also be used as the hard mask layer 203. A distance between the top surface of the fins 201 and the top surface of the isolation structure 202 may greater than a thickness of the hard mask layer 203, the surface of a subsequently formed second mask layer may be more even.

Figure 3:
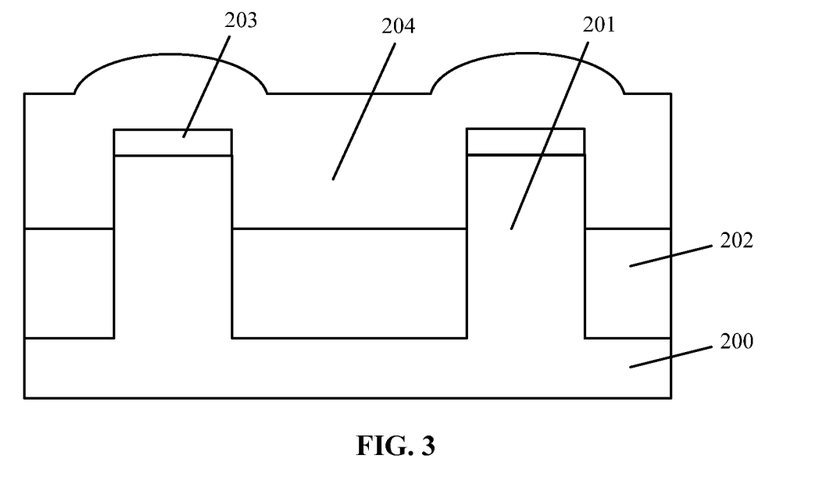

Returning to FIG. 17, after providing the semiconductor substrate 202 having the fins 201, the isolation structure 202 and the hard mask layer 203, a first dummy gate material layer may be formed (S102). FIG. 3 illustrates a corresponding semiconductor structure.

As shown in FIG. 3, a first dummy gate material layer 204 is formed on the fins 201 and the isolation structure 202. FIG. 3 is a cross-section view of FIG. 2 along the AA1 direction. A thickness of the dummy gate material layer 204 may be greater than a height of the fins 201, i.e., a height of a portion of the fins 201 protruding from the top surface of the isolation structure 202.

The first dummy gate material layer may be made of any appropriate material, such as poly silicon, silicon oxide, photo resist, or metal material, etc. In one embodiment, the first dummy gate material layer 204 is made of poly silicon. Various processes may be used to form the first dummy gate material layer 204 on the fins 201 and the isolation structure 202, such as a CVD process, a PVD process, an ALD process, or a spin-coating process, etc. After forming the first dummy gate material layer 204, because the top surface of the isolation structure 202 may be lower than the top surface of the fins 201, a portion of dummy gate material layer 204 on the fins 201 may be higher than a portion of the dummy gate material layer 204 on the isolation structure 202. Thus, a surface of the dummy gate material layer 204 may be uneven, which may affect subsequent processes. A planarization process may be required to remove the unevenness.

In certain other embodiments, a second oxide layer may be formed on the fins 201 before forming the first dummy gate material layer 204. The second oxide layer may be formed by oxidizing a portion of the fins 201. The second oxide layer may also be formed by a CVD process, or a chemical oxidation process. The second oxide layer may be used to protect the fins 201 during subsequent processes.

Figure 4:
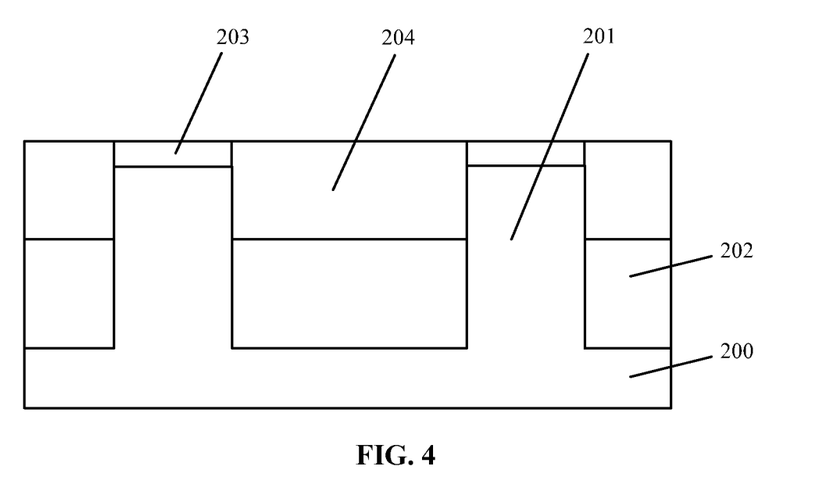

Returning to FIG. 17, after forming the first dummy gate material layer 204, a poling process may be performed (S103). FIG. 4 illustrates a corresponding semiconductor structure.

As show in FIG. 4, a portion of the first dummy gate material layer 204 is polished away, and a top surface of the remaining first dummy gate material layer 204 levels with the top surface of the hard mask layer 203. A polishing process may include a mechanical polishing process, a chemical mechanical polishing (CMP) process, or an ion beam polishing process, etc. In one embodiment, the first dummy gate material layer 204 is polished by a CMP process until the hard mask layer 203 is exposed.

Because the hard mask layer 203 and the first dummy gate material layer 204 may be made of different materials, CMP process rates may also be different. When the top surface of the hard mask layer 203 is exposed, the CMP process may be stopped. Therefore, the top surface of the remaining portion of the first dummy gate material layer 204 may level with the top surface of the hard mask layer 203. Because the hard mask layer 203 may be used as a polishing stop layer, a stop time of the CMP process may be controlled, an even surface of the first dummy gate material layer 204 may be formed.

Figure 5:
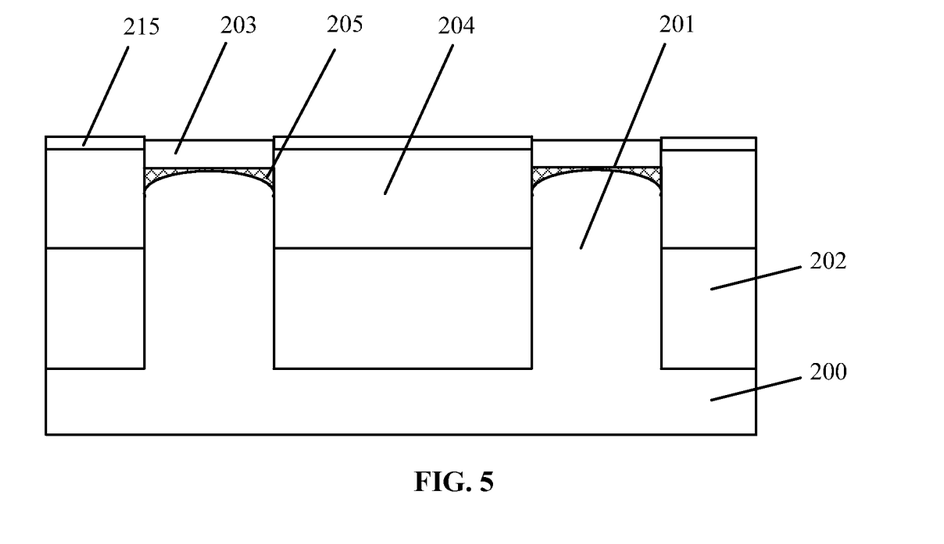

Returning to FIG. 17, after polishing the first dummy gate material layer 204, a protection layer may be formed on the remaining portion of the first dummy gate material layer 204, and a first oxide layer may also may formed (S104). FIG. 5 illustrates a corresponding semiconductor structure.

As shown in FIG. 5, a protection layer 215 is formed on the first dummy gate material layer 204. The protection layer 215 may be made of any appropriate material, such as silicon nitride, silicon oxide, silicon oxynitride, or metal material, etc. In one embodiment, the protection layer is made of silicon nitride, thus the protection layer 215 may refer as a silicon nitride layer. The protection layer 215 may be formed by various processes, such as a CVD process, a PVD process, or an ALD process, etc. In one embodiment, the protection layer 215 made of silicon nitride is formed by annealing the surface of the first dummy gate material layer 204 in a nitrogen environment. If the dummy gate material layer 204 is made of poly silicon, a thin protection layer 215, e.g. the silicon nitride layer, may be formed. The protection layer 215 may used to protect the first dummy gate material layer 204, and prevent the first dummy gate material layer 204 from being oxidized during a subsequent oxidation process.

Further, the fins 201 may be annealed at an oxygen environment, vertex angles of the fins 201 may be oxidized, and the first oxide layer 205 may be formed. Because the hard mask layer 203 may be relatively thin, and oxygen atoms may have a relatively fast diffusion speed in silicon oxide, oxygen atoms may diffuse to the surface of the fins 201 through the hard mask layer 203 under a high temperature. Further, because a specific surface area of the vertex angles of the fins 201 may be relatively large; more silicon atoms may be exposed, and may be easy to be oxidized. The vertex angles may be removed by subsequently removing the oxide layer 205, and a smooth surface may be obtained.

Figure 6:
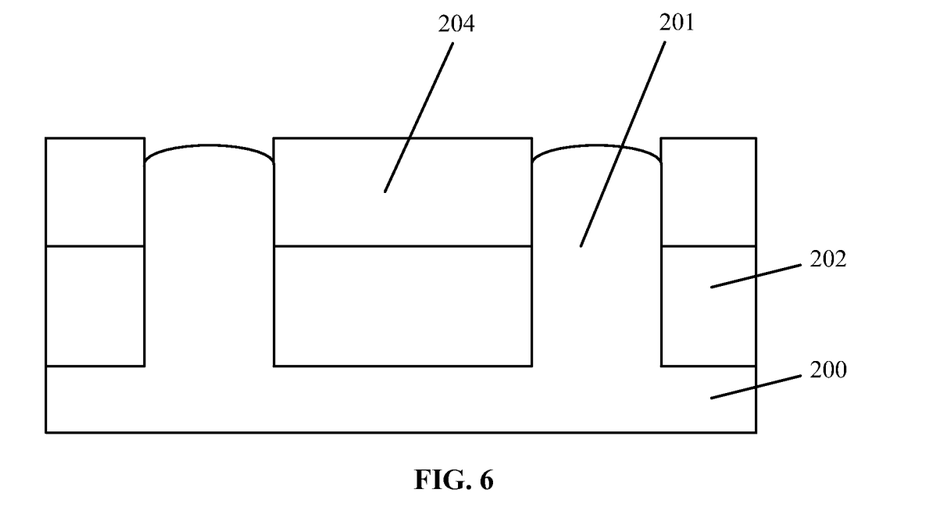

Returning to FIG. 17, after forming the first oxide layer 205, the hard mask layer 203 may be removed (S105). FIG. 6 illustrates a corresponding semiconductor structure.

As shown in FIG. 6, the hard mask layer 203 is removed. The hard mask layer 203 may be removed by any appropriate process, such a plasma etching process, a chemical etching process, or a CMP process, etc. In one embodiment, if the hard mask layer 203 is a stacked layer consisting of a layer of silicon nitride and a layer of silicon oxide, hot phosphate acid may be used to remove the silicon nitride layer, then a hydrogen fluoride solution may be used to remove the silicon oxide layer 205.

Referring to FIG. 6, the protection layer 215 (may refer as silicon nitride layer) on the first dummy gate material layer 204 may be removed simultaneously with removing the hard mask layer 203. Further, the first oxide layer 205 may also be removed during the process for removing the hard mask layer 203. The thickness of the first hard mask layer 203 may be relatively small, e.g. may be at nanometer scale. For example, the thickness of the hard mask layer may be in range of approximately 5 nm~15 nm. A height difference between the top surface of the first dummy gate material layer 204 and the top surface of the fins 201 may be equal to the thickness of the hard mask layer 203. Therefore, after removing the hard mask layer 203, A height difference between the top surface of the first dummy gate material layer 204 and the top surface of the fins 201 may also be in a range of approximately 5 nm~15 nm.

In certain other embodiments, the first oxide layer 205 may be kept by controlling an etching time of the process for removing the hard mask layer 203. The vertex angles of the fines 201 may be further oxidized. After a subsequent process for removing the first oxide layer 205, the vertex angle may be removed, and a smooth surface of the fins 201 may be obtained. The process for removing the vertex angels of fins 201 may refer as a fin rounding process. In certain other embodiment, the fin rounding process may be performed after removing a dummy gate.

Figure 7:
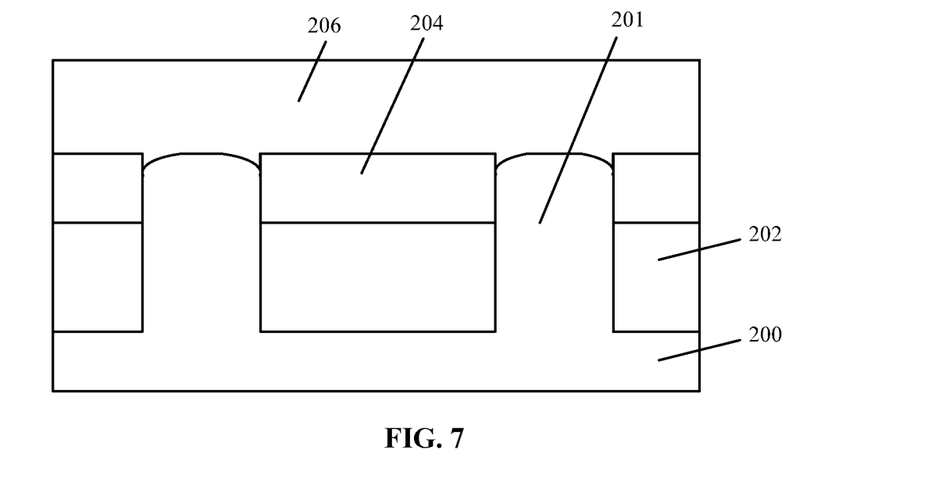

Returning to FIG. 17, after removing the hard mask layer 203, a second dummy gate material layer may be formed on the first dummy gate layer 204 (S106). FIG. 7 illustrates a corresponding semiconductor structure.

As shown in FIG. 7, a second dummy gate material layer 206 may be formed on the first dummy gate material layer 204. The fins 201 may also be covered by the second dummy gate material layer 206.

The second dummy gate material layer 206 may be made of any appropriate material, such as poly silicon, silicon oxide, photo resist, or metal material, etc. In one embodiment, the second dummy gate material layer 206 is made of poly silicon. Various processes may be used to form the second dummy gate material layer 206 on the fins 201 and the first dummy gate material layer 204, such as a CVD process, a PVD process, an ALD process, or a spin-coating process.

The height difference between the top surface of the first dummy gate material layer 204 and the top surface of the fins 201 may be the thickness of the hard mask layer 203. The thickness of the hard mask layer 203 may be relatively small, for example, the thickness of the hard mask layer 203 may be in a range of approximately 5 nm~15 nm. Thus, the height difference between the top surface of the first dummy gate material layer 204 and the top surface of the fins 201 may be relatively small.

Thus, when forming the second dummy gate material layer 206, it may be unnecessary to fill the dummy gate material layer 206 in a relative deep trench between two adjacent fins. Such deep trench filling may often occur in existing techniques. For example, a depth of the deep trench between two adjacent fins in existing techniques, i.e. a height of a portion of the fin protruding from an isolation structure (e.g., FIG. 1), may be in a range of approximately 100 nm-300 nm. Therefore, comparing FIG. 1 with FIG. 7, a more even surface of the second dummy gate material layer 206 may be obtained in the present disclosure.

Further, in one embodiment, the second dummy gate material layer 206 may be formed a CVD process, and the CVD process may have a good trench filling ability. A thickness of the second dummy gate material layer 206 may be relatively large, for example, the thickness of the second dummy gate material layer 206 may be in a range of approximately 100 nm~250 nm. Thus, after forming the second dummy gate material layer 206, the height difference between the top surface of the first dummy gate material layer 204 and the top surface of the fins 201 may be filled, and a more even surface of the second dummy gate material layer 206 may be obtained by the present invention.

The first dummy gate material layer 204 and the second dummy gate material layer 206 together may form one dummy gate material layer. Because the second dummy gate material layer 206 may have a more even surface, an uniform height of subsequently formed dummy gate at different fins 201 may be obtained after an etching process for forming the dummy gate, which may aid subsequent fabrication processes.

Figure 8:
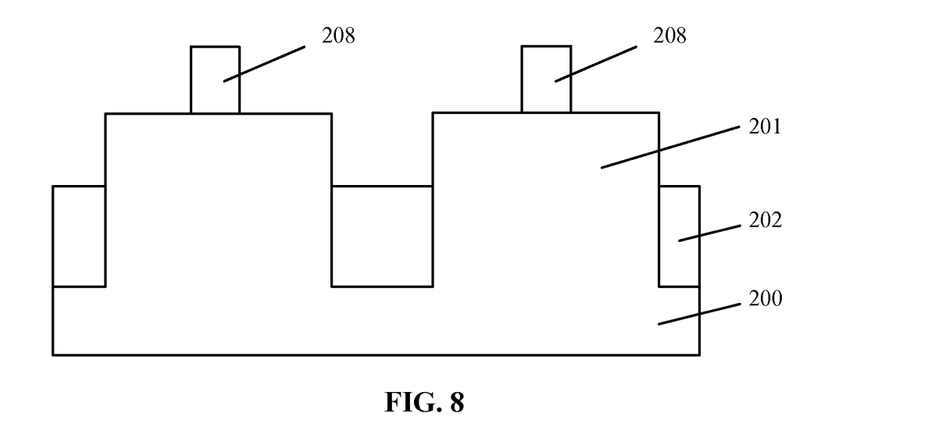

Returning to FIG. 17, after forming the second dummy gate material layer 206, a dummy gate may be formed on each of the fins 201 (S107). FIG. 8 illustrates a corresponding semiconductor structure. FIG. 8 is a cross-section view corresponding to the semiconductor structure shown in FIG. 1 along the BB1 direction.

As shown in FIG. 8, a dummy gate 208 is formed on each of the fins 201. In one embodiment, the dummy gate 208 may be formed by etching the second dummy gate material layer 206 and the first dummy gate material layer 204. An etching process for forming the dummy gate 208 may include forming a photo resist layer (not shown) on the second dummy gate material layer 206, and patterning the photo resist layer to form a pattern corresponding to the subsequently formed dummy gate 208. The etching process for forming the dummy gate 208 may also include etching the second dummy gate material layer 206 and the first dummy gate material layer 204 using the photo resist layer as an etching mask, and the dummy gate 208 is formed on each of the fins 201.

The etching mask may also be made of any other appropriate material, such as silicon nitride, silicon oxide, or silicon oxynitride, etc. The etching process may include a dry etching process including a plasma etching process or an ion beam etching process, or a wet etching process, etc.

Because the second dummy gate material layer 206 may have a more even surface, heights of all of the dummy gate 208 may be uniform after the etching process. Therefore, an uniformity of subsequently formed FinFETs may be achieved.

Figure 9:
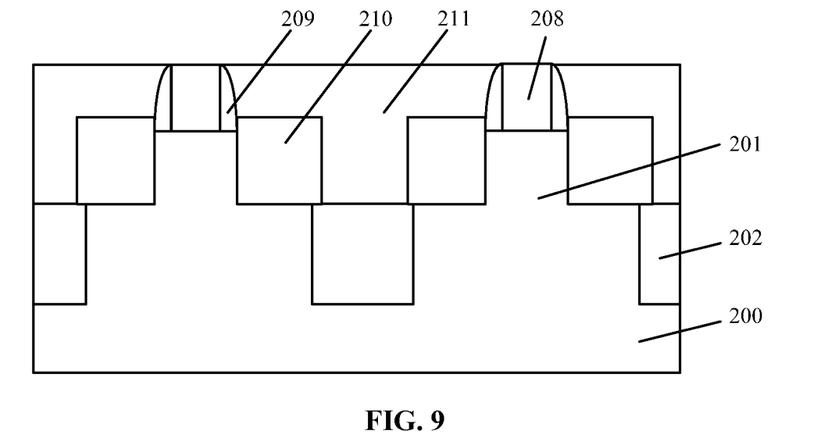

Returning to FIG. 17, after forming the dummy gate 208, sidewall spacers may be formed on both sides of the dummy gate 208; source/drain regions may be formed in each of the fins 201 at both sides of the dummy gate 208; and an interlayer dielectric layer may formed to cover the fins 201 and the isolation structure 202 (S108). FIG. 9 illustrates a corresponding semiconductor structure.

As shown in FIG. 9, sidewall spacers 209 are formed on both sides of the dummy gate 208. The sidewall spacers 209 may be made of different material, such as silicon oxide, silicon nitride, or silicon oxynitride, etc. The sidewall spacers 209 may be a single layer. The side wall spacer may also be a stacked layer having different materials.

Various appropriate methods may be used to form the sidewall spacers 209. In one embodiment, the sidewall spacers 209 may be formed by sequentially: forming a sidewall spacer material layer on the both sides of the dummy gate 208, the top surface of the fins 201 and the top surface of the isolation structure 202, and performing an etch back process on the sidewall spacer material layer. After the etch back process, a portion of the sidewall spacer material layer on both sides the dummy gate 208 may be kept, and may form the sidewall spacers 209. A remaining portion the sidewall spacer material layer on the top surface of the fins 201 and the top surface of the isolation structure 202 may be removed. The etch back process may include a dry etching process, or a wet etching process, etc.

Further, after forming the sidewall spacers 209, the source/drain regions 210 may be formed. Various processes may be used to form the source/drain regions 210, such as a direct ion implantation process, or an embedding process, etc. In one embodiment, the source/drain regions 210 are formed by an embedding process. The embedding process for forming the source/drain regions 210 may include sequentially: removing portions of each of the fins 201 at both sides of the dummy gate 208, filling the removed portions with a semiconductor material or conductive materials.

Therefore, the embedded source/drain regions 210 may be formed. The semiconductor material may include silicon germanium, or silicon nitride, etc. Other appropriate material may also be used as the semiconductor material to form the source/drain regions 210. A stress may be introduced into the channel region of a transistor by the embedded source/drain regions 210 and carrier mobility of the channel region may be enhanced.

The portions of the fins 201 may be removed by any appropriate process, such as a dry etching process, or a wet etching process, etc. Various methods may be used to fill the semiconductor material, such as a PVD process, a CVD process, an FCVD process, or a selective epitaxial growth process, etc. In one embodiment, a selective epitaxial growth process is used to fill the semiconductor material to form the source and drain regions 210.

In certain other embodiments, the source and drain regions 210 may also be formed by an ion implantation process. The ion implantation process may be performed on the portions of the fins 201 at both sides of the dummy gate 208, thus the source and drain regions 210 may be directly formed.

Further, after forming the source and drain region 210, the interlayer dielectric layer 211 (may refer as ILD0) may be formed to cover the fins 201 and the isolation structure 202. The interlayer dielectric layer 211 may be formed by sequentially: forming a dielectric material layer on the fins 201 and the isolation structure 202, and polishing the dielectric material layer to expose the top surface of the dummy gate 208. Thus, the interlayer dielectric layer 211 leveling with the top surface of the dummy gate 208 may be formed. A polishing process may be a mechanical polishing process, or a chemical mechanical polishing (CMP) process, etc. In one embodiment, the polishing process is a CMP process.

The interlayer dielectric layer 211 may be made of any appropriate material, such as silicon oxide, silicon nitride, or silicon oxynitride, etc. The interlayer dielectric layer 211 may function as an isolation layer.

Figure 10:
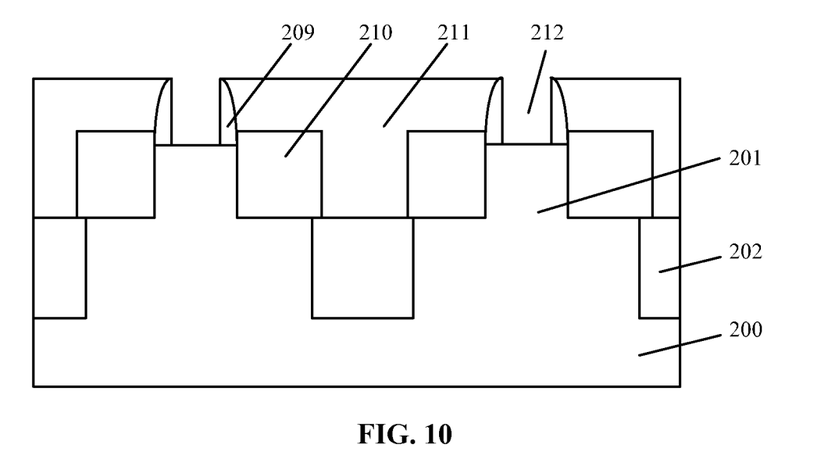

Returning to FIG. 17, after forming the interlayer dielectric layer 211, a first opening may be formed by removing the dummy gate 208 (S109). FIG. 10 illustrates a corresponding semiconductor structure.

As shown in FIG. 10, a first opening 212 is formed on each of the fins 201 by removing the dummy gate 208. A portion of the top surface of each of the fins 201 may be exposed by the first opening 212. The first opening 212 may be used to subsequently form a gate dielectric layer and a gate layer.

In one embodiment, the gate dielectric layer and the gate layer may be formed after forming the source/drain regions 210; this process may be referred as a gate-last process. In the gate-last process, a thermal budget of the gate dielectric layer and the gate layer may be reduced, a desirable threshold voltage may be obtained, and the performance of a transistor may be improved.

In certain embodiments, the portion of the top surface of the fins 201 exposed by the first opening 212 may be annealed in a hydrogen environment. A thermal annealing process for annealing the portion of the top surface of the fins 201 exposed by the first opening 212 may performed at approximately 950° C. for approximately 30 minutes under a hydrogen environment. The thermal annealing process may repair a damage of the fins 201, crystal lattice structures of the top surface of the fins 201 may be improved, and the performance of the transistor may be enhanced.

In certain other embodiments, a selective etching process and/or an oxidation process may be performed on the portion of the top surface of the fins 201 exposed by the first opening 212, and the damage of the surface of the fins 201 may be removed. Thus, the surface quality of the fins 201 may be improved, and the performance of the transistor may be enhanced.

Figure 11:
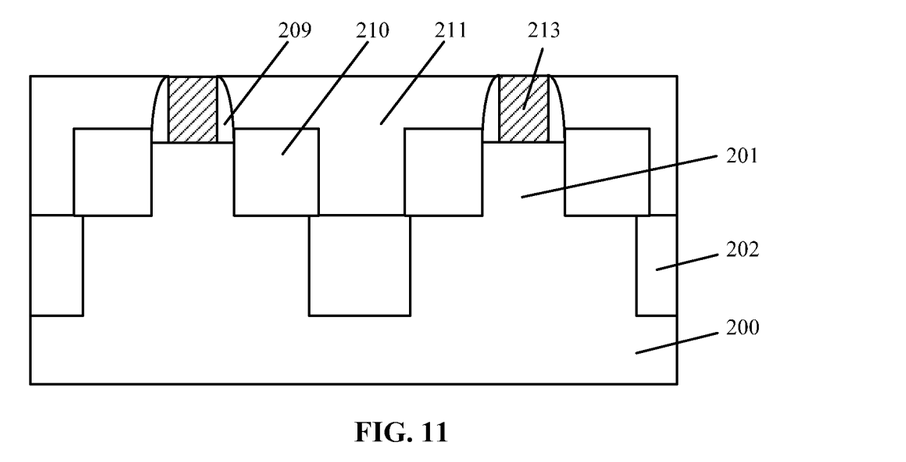

Returning to FIG. 17, after forming the first opening 212, a gate dielectric layer (not shown) and a metal gate 213 may be formed in the first opening 212 (S110). FIG. 11 illustrates a corresponding semiconductor structure.

As shown in FIG. 11, a metal gate 213 is formed in the first opening 212. A gate dielectric layer (not shown) may also be formed between the metal gate 213 and the fins 201. A gate dielectric material layer (not shown) may be formed in first opening 212, followed by forming a metal gate material layer on the gate dielectric layer. The gate dielectric material layer may be made of one or more of high-K dielectric material such as $HfO_2$, $Al_2O_3$, $ZrO_2$, HfSiO, HfSiON, HMO and HfZrO. Other appropriate material may also be used as the gate dielectric material. The metal gate material layer may be made of one or more of W, Al, Cu, Ti, Ta, TaN, NiSi, CoSi, TiN, TiAl and TaSiN.

Various processes may be used to form the gate dielectric material layer and the metal gate material layer 213, such as a CVD process, a PVD process, an ALD process, a FCVD process, an electro deposition process, etc. After forming the gate dielectric material layer and the metal gate material layer, a polishing process may performed to polish the gate dielectric material layer and the metal gate material layer until the top surface of the interlayer dielectric layer 211 is exposed, thus the dielectric layer (not shown) and the metal gate 213 may be formed. A polishing process may include a mechanical polishing process or a CMP process, etc. The gate structure consisting of the gate dielectric layer and metal gate layer is formed and may be referred as a high-K metal gate.

Figure 12:
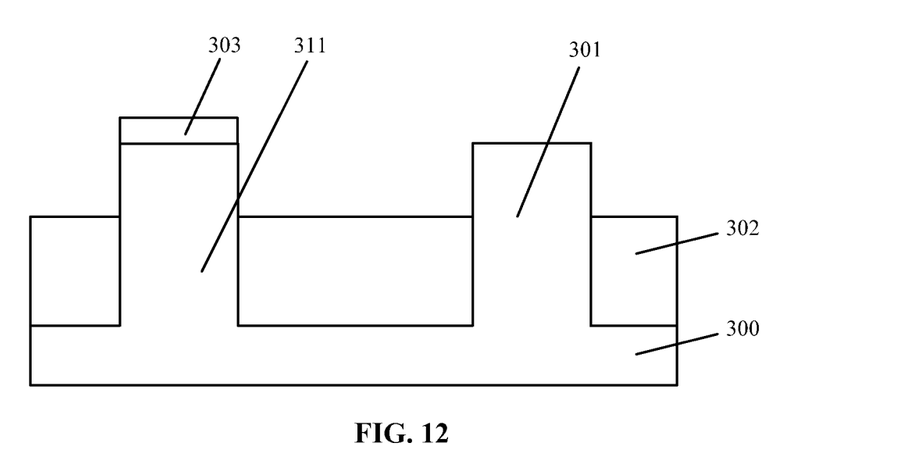
FIGS. 12-16 illustrate semiconductor structures corresponding to certain stages of another exemplary fabrication process consistent with the disclosed embodiments.

FIGS. 12-16 illustrate another FinFET fabrication process and corresponding semiconductor structures consistent with the disclosed embodiment. At the beginning of the fabrication process, as shown in FIG. 12, a semiconductor substrate with certain structures is provided.

Referring to FIG. 12, a semiconductor substrate 300 is provided. The semiconductor substrate may have a dummy fin 311 on one surface, and the dummy fin 311 may have a hard mask 303 on a top surface. The semiconductor may also have a fin 301 on the surface. An isolation structure 302 may be formed between the adjacent dummy fin 311 and the fin 301. A top surface of the fin 301 and the top surface of the dummy fin 311 may be higher than a top surface of the isolation structure 302. Further, a distance between the top surfaces of the fin 301 and the dummy fin 311 and the top surface of the isolation structure 302 may be greater than a thickness of the hard mask layer 303. The detailed descriptions of the semiconductor substrate 300 may refer to S101.

The differences between this fabrication process and the fabrication process in FIG. 17 include that the semiconductor substrate may have the dummy fin 311 besides the fin 301, and only the dummy fin 311 may have the hard mask layer 303. The fin 301 may be used to form a FinFET, and the dummy fin 311 may used as a process check monitor. Similarly, the hard mask layer 303 may be a hard mask layer from a process forming the fin 301 and the dummy fin 311 by etching the semiconductor substrate 300, and the hard mask layer 303 may also be an etching stop layer from a process for forming the isolation structure 302. The fin 301 may have the hard mask layer 303, too, but the hard mask layer 303 on the fin 301 may be removed, and only the dummy fin 311 may still have a hard mask layer 303 on its top surface.

The top surfaces of the fin 301 and the dummy fin 311 may be higher than the top surface of the isolation structure 302. Further, a height difference between the top surfaces of the fin 301 and the dummy fin 311 and the top surface of the isolation structure 302 is greater than a thickness of the hard mask layer 303. In one embodiment, the fin 301 may level with the top surface of the dummy fin 311. The thickness of the hard mask layer may be in a range of approximately 5 nm~15 nm. Further, the height difference between the top surfaces of the fin 301 and the dummy fin 311 and the top surface of the isolation structure 302 may be in a range of approximately 100 nm~300 nm.

The hard mask layer 303 may be a single layer or a stacked layer. In one embodiment, the hard mask layer 303 is a stacked layer consisting of a silicon nitride layer and a silicon nitride layer. The silicon nitride layer is on top of the silicon oxide layer.

The semiconductor substrate 300 may have a plurality of the dummy fins 311 on it. The plurality of dummy fins 311 may uniformly distribute on the surface of the semiconductor substrate 300. The hard mask layer 303 on the top surface of dummy fin 311 may be used as a polishing stop layer for a subsequent process for polishing a subsequently formed first dummy gate material layer. Therefore, an uniform thickness of the first dummy gate material layer may be obtained on the entire surface of the semiconductor substrate 300.

Figure 13:
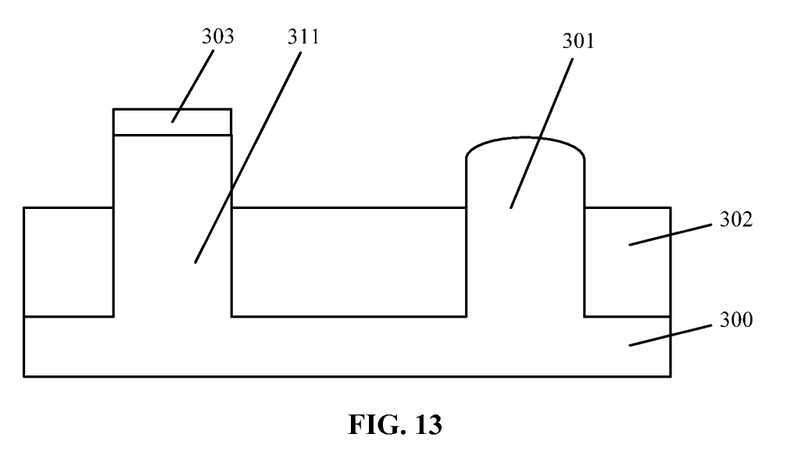

Further, referring to FIG. 13, an oxidation process may be performed on the fin 301, and vertex angles of the fin 301 may be removed. A process for removing the vertex angles of the fin 301 may include sequentially: oxidizing the fin 301 to form an oxide layer (not shown); and removing the oxide layer. Because a portion of the fin 301 at the vertex angles may have a relatively large specific surface area, the portion may be easy to be oxidized; a thicker oxide layer may be obtained. After removing the oxide layer, the vertex angles may be removed, and a smooth surface of the fin 301 without edges and angles may be obtained. Therefore, the performance of the transistor may be improved. A process for removing the vertex angles may refer as a fin rounding process. In certain other embodiments, the fin rounding process may be performed after removing a dummy gate.

The oxidation process may include a thermal oxidation process, a plasma oxidation process, or a chemical oxidation process, etc. In one embodiment, the oxidation process is a thermal oxidation process, i.e., annealing the fins 301 at high temperature in an oxygen environment. The oxide layer may be removed by any appropriate process, such as a plasma etching process, or a wet etching process, etc.

In certain other embodiment, after removing the oxide layer, an annealing process in a hydrogen environment may be performed to repair damages on the surface of the fin 301. Crystal structures of the surface of the fin 301 may be improved, and the performance of the transistor may be enhanced.

Figure 14:
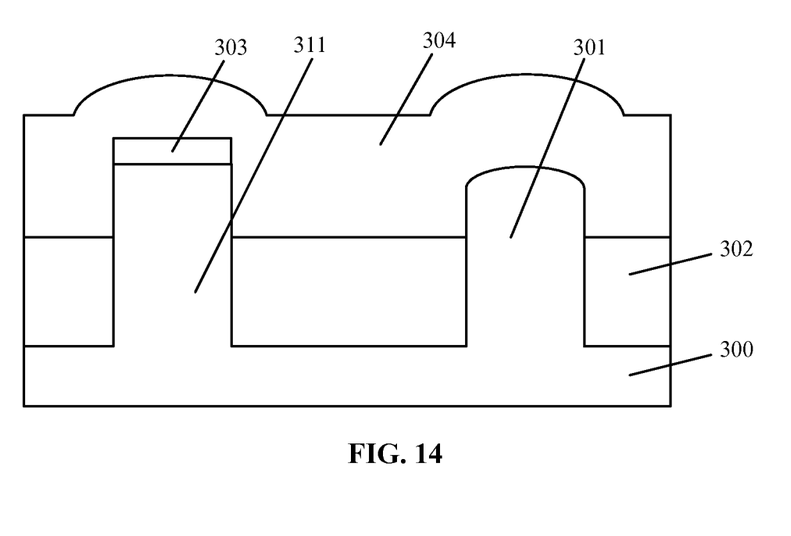

As shown in FIG. 14, after removing the oxide layer on the fin 301, a first dummy gate material layer 304 may be formed on the fin 310, the dummy fin 311, and the isolation structure 302. A thickness of the first dummy gate material layer 304 may be greater than heights of the fin 301 and the dummy fin 311.

The first dummy gate material layer 304 may be made of any appropriate material, such as poly silicon, silicon oxide, silicon nitride, or silicon oxynitride, etc. In one embodiment, the first dummy gate material layer 304 is made of poly silicon. Various processes may be used to form the first dummy gate material layer 304, such as a CVD process, a PVD, an ALD process, or an FCVD process, etc.

Since the top surface of the isolation structure 302 may be lower than the top surfaces of the fin 301 and the dummy fin 311, after forming the first dummy material layer 304, a portion of the first dummy gate material layer 304 on the top surfaces of the fin 301 and the dummy fin 311 may be higher than a portion of the first dummy gate material layer 304 on the isolation structure 302. Therefore, an uneven surface of the first dummy gate material layer 304 may be obtained. The uneven surface of the first dummy gate material layer 304 may affect subsequent fabrication processes, a planarization process may be performed to cause a top surface of the first dummy gate material layer 304 to be flat.

Figure 15:
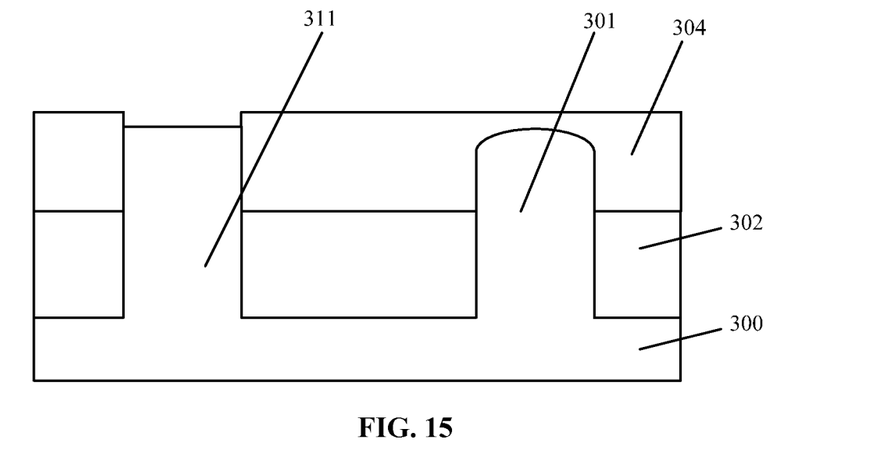

Referring to FIG. 15, a planarization process is performed to polish the first dummy gate material layer 304 until the top surface of the isolation structure 303 is exposed. Various processes may used to polish the first dummy gate material layer 204, such as a mechanical polish process, or a CMP process, etc. In one embodiment, the first dummy gate material layer 204 is polished by a CMP process. The CMP process is used to polish the first dummy gate material layer 204, and the hard mask layer 203 may be used as a polishing stop layer.

Since the hard mask layer 303 and the first dummy gate material layer 304 may be made of different materials, polishing rates of the first dummy gate material layer 304 and the hard mask layer 303 may be different. When the top surface of the hard mask layer 303 is exposed, the CMP process may be stopped, then a top surface of the first dummy gate material layer 304 may level with the top surface of the hard mask layer 303.

The hard mask layer 303 may be used as a polishing stop layer, a stopping time of the polishing process may be controlled, thus a more even surface of the first dummy gate material layer 304 may be obtained. Further, the top surface of the hard mask layer 303 may be higher than the top surface of the fin 301; the polishing process may be unlikely to damage the fin 301.

Referring to FIG. 15, the hard mask layer 303 may be removed after the polishing process. The hard mask layer 303 may be removed by any appropriate process, such as a plasma etching process, an ion beam etching process, or a wet chemical etching process, etc. Because the thickness of the hard mask layer 303 may be relatively thin, e.g., in a nanoscale, a height of the top surface of the dummy gate material layer 304 may be almost similar to a height of the top surface of the dummy fin 311.

Figure 16:
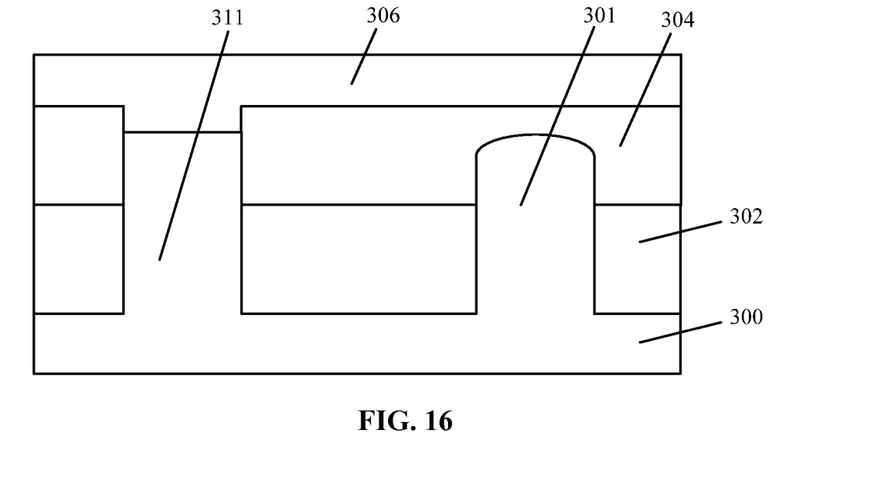

After removing the hard mask layer 303, as shown in FIG. 16, a second dummy gate material layer 306 may be formed on the first dummy gate material layer 304. The second dummy gate material layer 306 may also cover the top surface of the fin 301.

The second dummy gate material layer 306 may be made of any appropriate material, such as poly silicon, silicon nitride, silicon oxide, or silicon oxynitride, etc. In one embodiment, the second dummy gate is made of poly silicon. The second dummy gate material layer 306 may be formed by various processes, such as a CVD process, an FCVD process, or a PVD process, etc.

Since the height difference between the top surface of the first dummy gate material layer 304 and the top surface of the dummy fin 311 may be relatively small, after forming the second dummy gate material layer 306, a more even surface of the second dummy gate material layer 306 may be obtained. The first dummy gate material layer 304 and the second dummy gate material layer 306 may form a final dummy gate material layer. Because the top surface of the second dummy gate material layer 306 may be more even, the final dummy gate material layer may be more even as well. Therefore, subsequently formed dummy gates on the entire fins 301 may have a uniform height, which may aid subsequent fabrication processes.

After forming the second dummy gate material layer 306, a dummy gate may be formed on the fin 301, and sidewall spacers may be formed on both sides of the dummy gate. Further, embedded source/drain regions may be formed in the fin 301 at both sides of the dummy gate, and a dielectric layer may be formed to cover the fin 301 and the isolation structure 302. A top surface of the dielectric layer may level with a top surface of the dummy gate. Further, the dummy gate may be removed to form a first opening to expose a portion of the top surface of the fin 301, and a gate dielectric layer and a metal gate layer may be sequentially formed in the first opening. The detailed description may refer to S109-S110 described in FIG. 17.

Thus, a FinFET may be formed by the above disclosed processes and methods, the corresponding FinFET is shown in FIG. 11. The FinFET includes a semiconductor substrate 200 having a plurality of fins 201 and an isolation layer 202. The FinFET also includes embedded source/region regions at both sides of the fins 201. Further, the FinFET includes a high-K metal gate 213 and sidewall spacers 209. The FinFET also includes an interlayer dielectric layer 211. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor, comprising:
    providing a semiconductor substrate;
    forming a plurality of fins and an isolation structure on top of the semiconductor substrate, wherein the fins are covered with a hard mask layer;
    forming a first dummy gate layer on the fins and the isolation structure;
    polishing the first dummy gate layer using the hard mask as a polishing stop layer and until the hard mask layer is exposed;
    after polishing the first dummy gate layer, removing the hard mask layer to expose a top surface of the fins;
    after removing the hard mask layer, forming a second dummy gate layer on the first dummy gate layer and also on the exposed top surface of the fins; and
    etching the second dummy gate layer and the first dummy gate layer such that the second dummy gate layer is etched to form a dummy gate on each of the fins and the first dummy gate layer is removed to expose the isolation structure between adjacent fins.

2. The method according claim 1, after forming the dummy gate, further including:
    forming sidewall spacers on both sides of the dummy gate;
    forming source/drain regions in the fins at both sides of the dummy gate;
    forming an interlayer dielectric layer on top of the semiconductor substrate;
    polishing the interlayer dielectric layer to planarize the interlayer dielectric layer and to expose the dummy gate;
    removing the dummy gate to form a first opening; and
    forming a high-K metal gate in the first opening.

3. The method according to claim 1, wherein, after polishing the first dummy gate layer, the step of removing the hard mask layer to expose the top surface of the fins further includes:
    forming a protection layer on the first dummy gate layer after polishing to protect the polished first dummy gate layer form being oxidized;
    oxidizing vertex angles at a top portion of the fins under the hard mask layer to form a first oxide layer by oxidizing the top portion of the fins under the hard mask layer;
    removing the protection layer simultaneously during the removing of the hard mask layer to expose the first dummy gate layer; and
    removing the first oxide layer partially or totally to round the top surface of the fins to expose the top surface of the fins.

4. The method according to claim 2, before forming the high-K metal gate, further including at least one of:
    annealing the fins in a hydrogen environment, selectively etching the fins, and oxidizing the fins to repair damages of the fins.

5. The method according to claim 1, before forming the first dummy gate layer, further including:
   forming a second oxide layer.

6. The method according to claim 1, wherein:
   a thickness of the hard mask layer is in a range of approximately 5 nm to 15 nm.

7. The method according to claim 1, wherein:
   a height difference of a top surface of the fins and a top surface of the isolation structure is in a range of approximately 100 nm to 300 nm.

8. The method according to claim 1, wherein:
   the hard mask layer is a stacked layer made of silicon nitride and silicon oxide, and the silicon nitride is on the top of the silicon oxide.

9. The method according to claim 1, wherein:
   the first dummy gate layer and the second dummy gate layer are made of poly silicon.

10. The method according to claim 2, wherein:
    the source region/drain regions are embedded source/drain regions.

11. The method according to claim 10, wherein:
    the source region/drain regions are formed by an selective epitaxy process.

12. The method according claim 1, wherein the etching of the second dummy gate layer and the first dummy gate layer uses a same photoresist layer as an etching mask.

13. The method according claim 1, wherein the second dummy gate layer and the first dummy gate layer is simultaneously etched in a same process.

* * * * *